United States Patent
Hinks et al.

(10) Patent No.: US 6,507,190 B1
(45) Date of Patent: Jan. 14, 2003

(54) METHOD AND APPARATUS FOR COMPENSATING POLARIZING FIELDS IN MAGNETIC RESONANCE IMAGING

(75) Inventors: Richard Scott Hinks, Waukesha, WI (US); John E. Lorbiecki, Hubertus, WI (US)

(73) Assignee: GE Medical Systems Global Technologies Company LLC, Waukesha, WI (US)

( * ) Notice: Subject to any disclaimer, the term of this patent is extended or adjusted under 35 U.S.C. 154(b) by 0 days.

(21) Appl. No.: 09/630,101

(22) Filed: Aug. 1, 2000

(51) Int. Cl.[7] .................................................. G01V 3/00
(52) U.S. Cl. ........................ 324/307; 324/318; 324/322
(58) Field of Search ................................ 324/307, 309, 324/318, 320, 322, 321

(56) References Cited

U.S. PATENT DOCUMENTS

| 4,642,569 A | * | 2/1987 | Hayes et al. ................ 324/318 |
|---|---|---|---|
| 4,646,046 A | | 2/1987 | Vavrek et al. ............... 335/301 |
| 4,689,563 A | * | 8/1987 | Bottomley et al. .......... 324/309 |
| 4,698,591 A | | 10/1987 | Glover et al. ................ 324/307 |
| 5,289,127 A | | 2/1994 | Doddrell et al. ............. 324/314 |
| 5,488,950 A | | 2/1996 | Ehnholm ................... 128/653.1 |
| 5,770,943 A | | 6/1998 | Zhou .......................... 324/307 |
| 5,773,976 A | * | 6/1998 | Sakakura et al. ............ 324/318 |
| 5,952,734 A | | 9/1999 | Gelbien ........................ 307/91 |
| 5,994,991 A | | 11/1999 | Laskaris et al. ............. 335/299 |
| 5,999,075 A | | 12/1999 | Laskaris et al. ............. 335/299 |
| 6,163,240 A | * | 12/2000 | Zuk et al. .................... 324/318 |
| 6,242,915 B1 | * | 6/2001 | Hurd ........................... 324/309 |

* cited by examiner

*Primary Examiner*—Edward Lefkowitz
*Assistant Examiner*—Dixomara Vargas
(74) *Attorney, Agent, or Firm*—Quarles & Brady, LLP; Carl Horton

(57) ABSTRACT

Monitor signals are acquired in an interleaved manner during a scan with an MRI system. Frequency changes caused by variations in the polarizing field $B_0$ are measured using the monitor signals, and these measured frequency changes are employed to compensate image data acquired during the scan. Electrical currents are produced in a set of shim coils that shim the polarizing field $B_0$ in the immediate vicinity proximal to the monitor coil.

18 Claims, 4 Drawing Sheets

METHOD AND APPARATUS FOR COMPENSATING POLARIZING FIELDS IN MAGNETIC RESONANCE IMAGING

BACKGROUND OF THE INVENTION

The field of the invention is nuclear magnetic resonance imaging (MRI) methods and systems. More particularly, the invention relates to the removal of artifacts in MRI images produced by changes in the polarizing magnetic field during data acquisition.

When a substance, such as human tissue, is subjected to a uniform magnetic field (polarizing field $B_0$), the individual magnetic moments of the spins in the tissue attempt to align with the polarizing field $B_0$, but instead precess about it in random order at a characteristic Larmor frequency, which is determined by the gyromagnetic constant $\gamma$ of the spins and the polarizing field $B_0$. If the substance, or tissue, is subjected to a magnetic field (excitation field $B_1$) which is in the x-y plane and which is near the Larmor frequency, the net aligned moment $M_z$ may be rotated or "tipped" into the x-y plane to produce a net transverse magnetic moment $M_t$. A signal is emitted by the excited spins, and after the excitation field $B_1$ is terminated, a nuclear magnetic resonance (NMR) signal may be received and processed to form an image.

When utilizing these signals to produce images, magnetic field gradients ($G_x$, $G_y$, and $G_z$) are employed. Typically, the region to be imaged is scanned by a sequence of separate measurement cycles (referred to as "views") in which these gradients vary according to the particular localization method being used. The resulting set of received NMR signals are digitized and processed to reconstruct the image using one of many well-known reconstruction techniques.

A well-known problem with MRI systems is that variations occur in the strength of the polarizing field $B_0$. Such variations affect acquired images in two ways. First, changes in the polarizing field $B_0$ cause corresponding changes in the phase of the acquired NMR signals. Such spurious phase changes appear in the acquired NMR signals, or "k-space data", and result in the ghosting or blurring of artifacts in images reconstructed using Fourier transformation methods. Since the spurious phase changes accumulate continuously between RF excitation and data acquisition, the artifacts are particularly troublesome with gradient recalled echo pulse sequences having a long echo time TE. Changes in the polarizing field $B_0$ can also cause apparent spatial shifts along the frequency encoding (i.e. readout) gradient direction.

The second deleterious effect of changes in the polarizing field $B_0$ occurs when slice selection techniques are used in the pulse sequence. The change in the polarizing field $B_0$ shifts the location of the excited slice by an amount equal to the change in Larmor frequency divided by the bandwidth of the selective RF excitation pulse. For example, if the polarizing field $B_0$ shifts the Larmor frequency by 20 Hz and the selective RF excitation pulse has a bandwidth of 1000 Hz, the excited slice will shift 2% from its expected position along the slice select gradient axis. Such shifts can cause amplitude changes in the acquired data.

Many methods are used to control and regulate the polarizing field $B_0$. Most of these methods deal with changing conditions within the scanner itself and are quite. effective. For example, methods for compensating the effects on the polarizing field $B_0$ due to Eddy currents produced by changing magnetic field gradients are disclosed in U.S. Pat. Nos. 4,698,591; 5,289,127; and 5,770,943.

The strength of the polarizing field $B_0$ can be affected by external events such as the movement of large masses of metal in the vicinity of the scanner. Moving objects, such as cars, trucks, trains and elevators, often change the polarizing field $B_0$ and produce image artifacts.

Two methods have been used to reduce the effects of such disturbances, namely passive methods and active methods. Passive methods include the use of shielding materials around the main magnet as described, for example, in U.S. Pat. No. 4,646,046. Massive amounts of silicon steel sheets are placed around the magnet, which results in an expensive, heavy, and difficult to install system.

Active compensation systems employ a sensor that measures the change in magnetic flux at a location near the scanner and uses this information to compensate the system. Such compensation may include producing a current in a coil that generates an offsetting correction magnetic field. Such methods employ flux sensors as described, for example, in U.S. Pat. No. 5,952,734 or in ESR instruments as disclosed in U.S. Pat. No. 5,488,950. These active methods do not work well when the field disturbance is produced by multiple sources or sources of varying magnitude or location.

Acquiring NMR signals in order to monitor the stability of a magnetic field can be achieved using a dedicated probe that consists of an RF coil and an NMR sample that is placed in a region that is consistent with reliable magnetic field uniformity. Placement of the probe in the shimmed volume of the MRI magnets interferes with the region to be occupied and is subject to operator error. Placement of the probe outside the shimmed volume of the MRI magnets, on the other hand, degrades the quality of the signal from the dedicated NMR probe. What is needed, therefore, is an apparatus and method allowing placement of the dedicated monitoring probe outside the shimmed volume of the magnet while retaining adequate magnetic field uniformity in order to improve the utility and quality of the acquired monitor signals.

SUMMARY OF THE INVENTION

In recognition of the foregoing problems and shortcomings, the method of the present invention acquires an image from a subject with an MRI system by performing an imaging pulse sequence with the MRI system in order to acquire image data from which an image is reconstructed. Then, the method performs a plurality of monitoring pulse sequences with the MRI system in order to acquire data from an RF monitoring coil that is located near the subject for compensating for changes in the polarizing field $B_0$ during the acquisition of image data. As a result, monitoring pulse sequences are interleaved with imaging pulse sequences. Finally, the present method shims the polarizing field $B_0$ in the immediate vicinity of the RF monitor coil by producing currents in the shim coils during each monitoring pulse sequence.

Another aspect of the present invention includes a monitor coil assembly comprising an NMR sample, a monitor coil disposed around the sample, and a set of shim coils disposed adjacent to the monitor coil, and a set of shim amplifiers whereby electrical currents are produced in the set of shim coils that shim the polarizing field $B_0$ in the immediate vicinity proximal to the monitor coil.

DESCRIPTION OF THE PREFERRED EMBODIMENT

Figure 1:
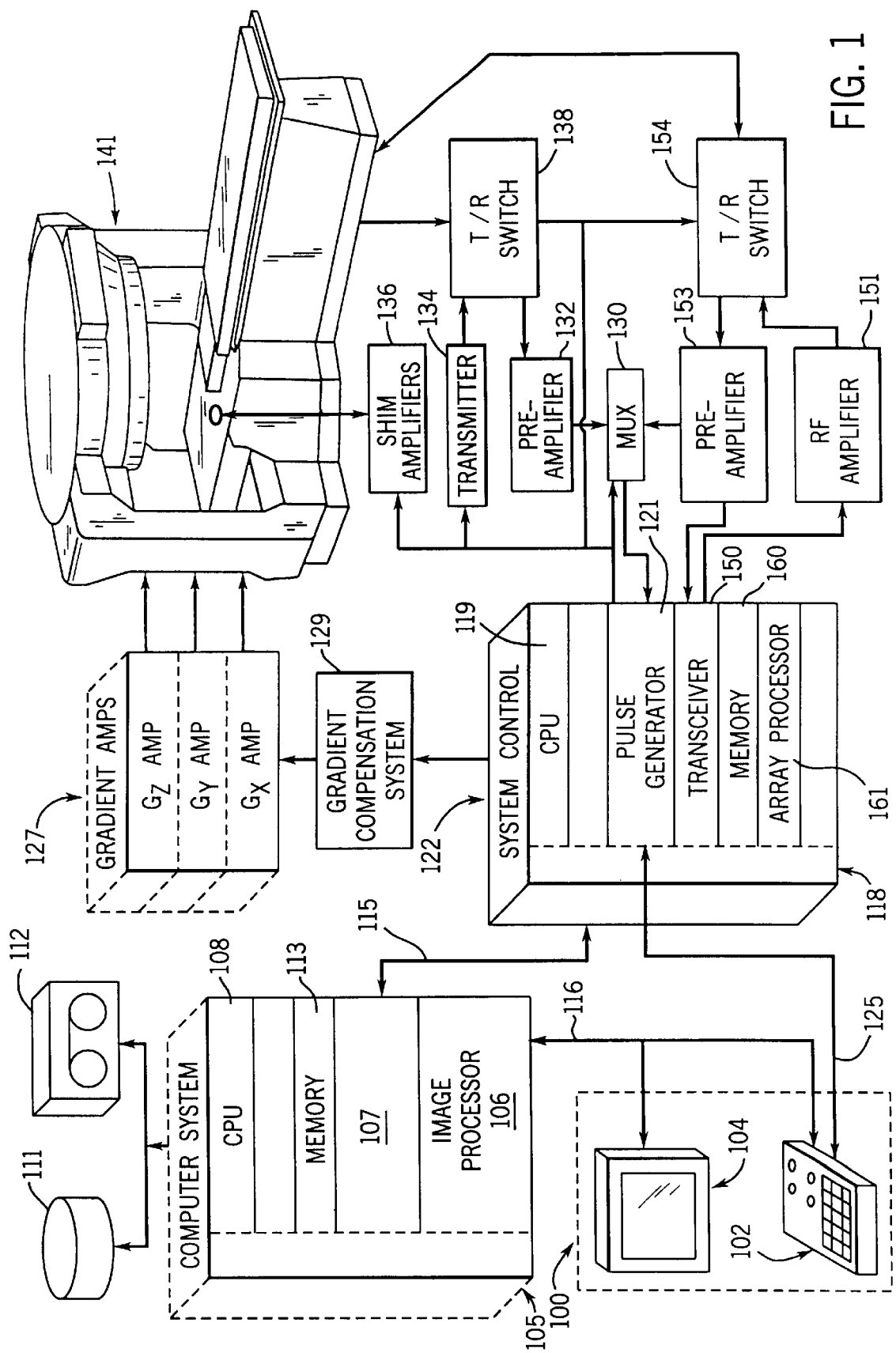
FIG. 1 is a block diagram of a known MRI system that has been modified to practice the present invention.

With initial reference to FIG. 1, the major components of a preferred MRI system are shown, as modified to incorporate the present invention. The operation of the MRI system is controlled from an operator console 100 that includes a keyboard (not shown), control panel 102, and a display 104. The operator console 100 preferably communicates through a serial link 116 with a separate computer system 107 that enables an operator to control the production and display of images on the display 104. The separate computer system 107 includes a number of modules that communicate with each other through a backplane 105. These modules include an image processor module 106, a CPU module 108, and a memory module 113, known in the art as a frame buffer for storing image data arrays. The computer system 107 is linked to a disk storage 111 and tape drive 112 for storage of image data and programs, and it communicates with a separate system control 122 through a high speed serial link 115.

The system control 122 includes a number of modules that communicate with each other through a backplane 118. These modules include a CPU module 119 and a pulse generator module 121 that connects to the operator console 100 through a serial link 125. It is through this serial link 125 that the system control 122 receives commands from the operator to indicate the scan sequence that is to be performed. The pulse generator module 121 then operates the system components to carry out the desired scan sequence. It produces data that indicates the timing, strength, and shape of the RF pulses that are to be produced, and the timing and length of the data acquisition window. The pulse generator module 121 connects to a set of gradient amplifiers 127 through a gradient compensation system 129 in order to indicate the timing and shape of the gradient pulses to be produced during a scan. The pulse generator module 121 also connects to a multiplexor 130 that receives signals from various preamplifiers 132, 153 associated with the condition of the patient and the magnet assembly 141. Through this multiplexor 130, signals are received back at the pulse generator module 121 from the pre-amplifiers 132, 153 and a plurality of transmit/receive switches 138, 154.

The gradient waveforms produced by the pulse generator module 121 are compensated by the gradient compensation system 129, as will be described in more detail below, and applied to the gradient amplifier system comprised of the gradient amplifiers 127. Each gradient amplifier 127 excites a corresponding gradient coil (not shown) that forms a part of the magnet assembly 141. As is well known in the art, these gradient coils produce linear magnet field gradients that are used for position encoding acquired signals. The magnet assembly 141 also includes a polarizing magnet and a whole-body RF monitor coil 404 shown in elevation view in FIG. 7. In a preferred embodiment, the polarizing field $B_0$ is produced by a permanent magnet and an associated iron core that is used to shape and direct the field, as described in U.S. Pat. No. 5,652,517 entitled "Magnet Assembly for MRI Apparatus.

Figure 3:
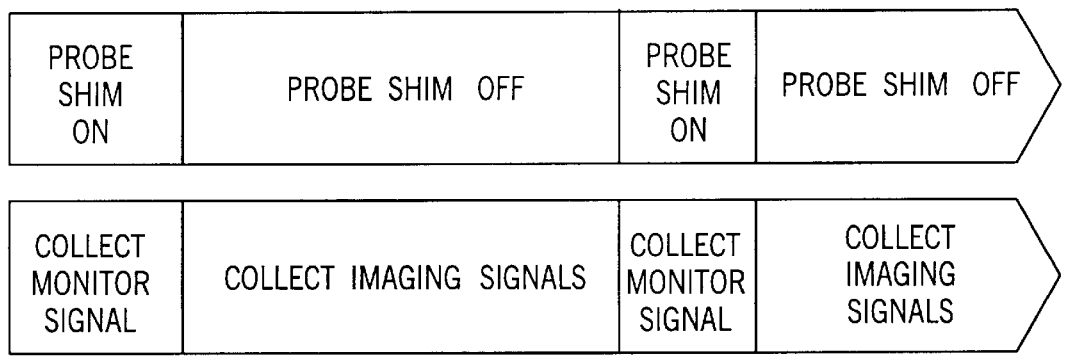
FIG. 3 is a timing sequence for probe shimming and data acquisition.

A transceiver module 150 in the system control 122 produces RF pulses that are amplified by an RF power amplifier 151 and coupled to the RF coil in the magnet assembly 141 by the transmit/receive switch 154. The resulting signals radiated by the excited nuclei in the patient may be sensed by the same RF coil and coupled through the transmit/receive witches 138, 154 to the respective pre-amplifiers 132, 153. The amplified NMR signals are demodulated, filtered, and digitized in a receiver section (not shown) of the transceiver module 150. In particular, the transmit/receive switch 154 is controlled by a signal from the pulse generator module 121 to electrically connect the RF power amplifier 151 to the RF coil during the transmit mode, and to the pre-amplifier 153 during the receive mode. The transmit/receive switch 154 also enables the separate RF calibration coil of this invention to be used in either the transmit or receive mode as will be described in more detail below. Similarly, the transmit/receive switch 138 is controlled by a signal from the pulse generator module 121 to electrically connect a transmitter 134 to the RF coil during the transmit mode, and to the pre-amplifier 132 during the receive mode. A preferred timing sequence for probe shimming and data acquisition is shown in FIG. 3.

The NMR signals picked up by the RF coil are digitized by the transceiver module 150 and transferred to a memory module 160 in the system control 122. When a scan is completed and an entire array of data has been acquired in the memory module 160, an array processor 161 operates to transform the data into an array of image data. This image data is conveyed through the serial link 115 to the computer system 107 where it is stored in the disk storage 111. In response to commands received from the operator console 100, this image data may also be archived on the external tape drive 112, or it may be further processed by the image processor module 106 and conveyed to the operator console 100 and presented on the display 104.

Figure 2:
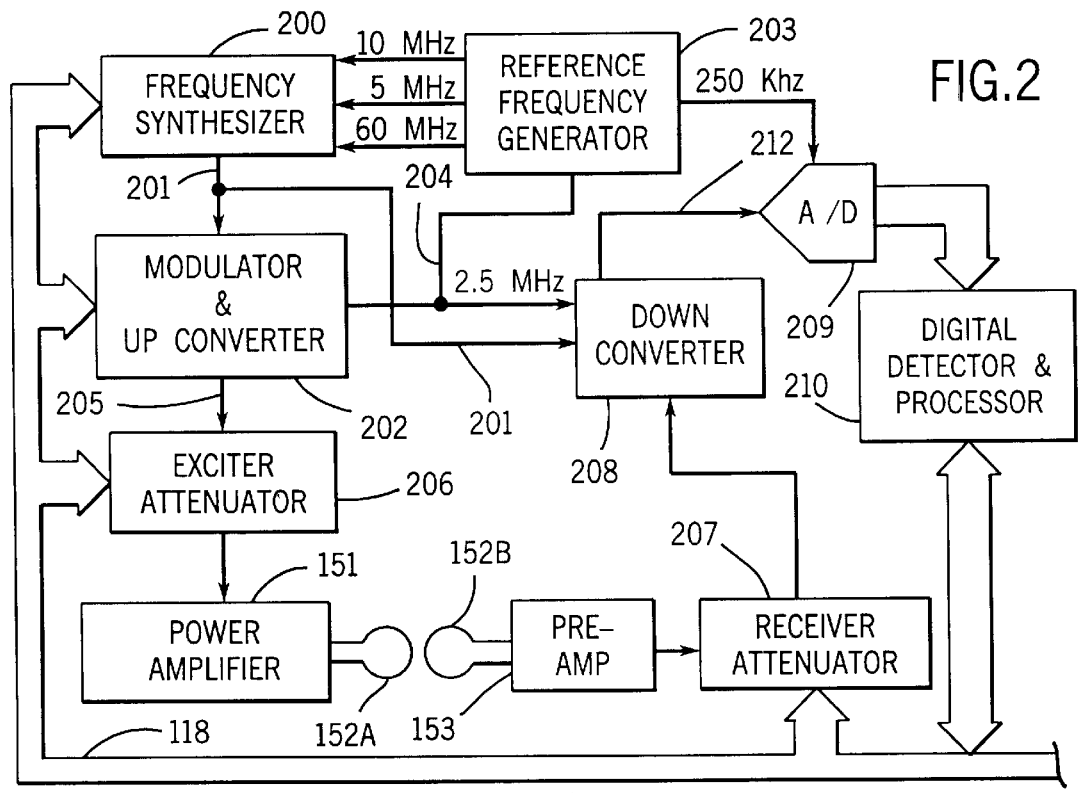
FIG. 2 is an electrical block diagram of the transceiver module of FIG. 1.
Figure 7:
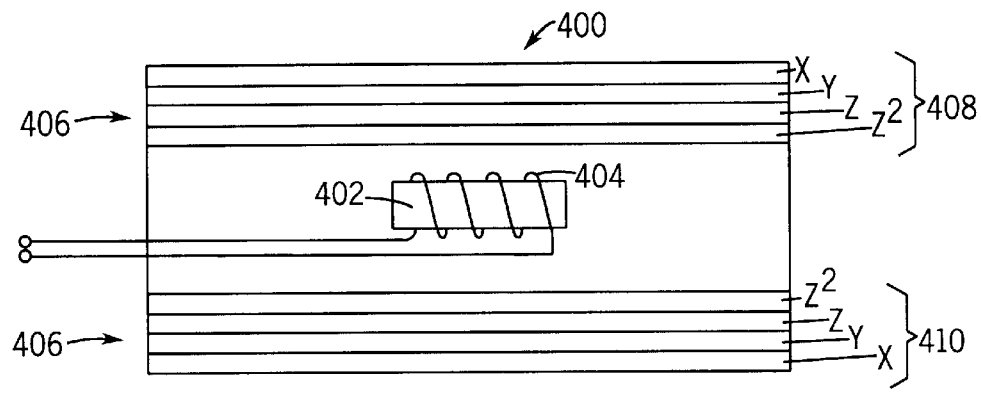
FIG. 7 is a simplified elevation view of the monitor coil assembly of FIG. 1, with various parts removed.

Referring particularly to FIGS. 1–2, the transceiver module 150 produces the RF excitation field $B_1$ through the RF power amplifier 151 at a first coil 152A and receives the resulting NMR signal induced in a second coil 152B. As indicated above, the coils 152A, 152B may be separate as shown in FIG. 2, or they may be a single wholebody coil as shown in FIG. 7. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) received from the pulse generator module 121. The signal R(t) defines the envelope of the RF excitation pulse to be produced and is produced in the pulse generator module 121 by sequentially reading out a series of stored digital values.

These stored digital values may, in turn, be changed from the operator console 100 to enable any desired RF pulse envelope to be produced.

The magnitude of the RF excitation pulse produced at output 205 is attenuated by an exciter attenuator circuit 206 that receives a digital command TA from the backplane 118. The attenuated RF excitation pulses are applied to the RF power amplifier 151 that drives the RF coil 152A. For a more detailed description of this portion of the transceiver module 150, reference is made to U.S. Pat. No. 4,952,877, which is incorporated herein by reference.

Referring still to FIGS. 1–2, the NMR signal produced by the subject is picked up by the receiver coil 152B and applied through the preamplifier 153 to the input of a receiver attenuator 207. The receiver attenuator 207 further amplifies the signal by an amount determined by a digital attenuation signal RA received from the backplane 118.

The received signal is at or around the Larmor frequency, and this high frequency signal is down converted in a two step process by a down converter 208 that first mixes the NMR signal with the carrier signal on line 201 and then mixes the resulting difference signal with a 2.5 MHz reference signal on line 204. As described above, the phase of the carrier signal on line 201 is controlled by the frequency synthesizer 200 in response to a phase command received from the pulse generator module 121. To practice the preferred embodiment, this phase command is changed during the acquisition of data to offset, or compensate, for changes in the strength of the polarizing field $B_0$.

The down converted NMR signal is applied to the input of an analog-to-digital converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output through the backplane 118 and to the memory module 160 where they are employed to reconstruct an image.

The 2.5 MHz reference signal, as well as the 250 kHz sampling signal and the 5, 10 and 60 MHz reference signals, is produced by a reference frequency generator 203 from a common 20 MHz master clock signal. For a more detailed description of the receiver, reference is made to U.S. Pat. No. 4,992,736, which is incorporated herein by reference.

Moving metal (i.e., a car, truck, elevator, train, etc.) that passes near the MRI system can causes the strength of the polarizing field $B_0$ to change as a function of time $B_0(t)$. As a function of time, the polarizing field $B_0(t)$ variations from moving objects tends to be a low frequency function wherein the polarizing field $B_0$ changes smoothly over the course of 0.5 to 2.0 seconds. A peak displacement from the baseline polarizing field $B_0$ may vary from a few Hz (cars) to tens or even hundreds of Hz (trucks and larger). This variation in the polarizing field $B_0$ is much slower than the fluctuations that are observed from magnetic vibration (1–100 Hz), leading to the observation that these slower polarizing field $B_0$ fluctuations may be compensated by measuring the polarizing field $B_0$ with monitor echoes and compensating the observed frequency changes either prospectively (frequency shifting the transceiver reference frequency) or retrospectively during image reconstruction.

The variations in the polarizing field $B_0(t)$ that are caused by moving metal objects produce phase shifts in the acquired NMR signals S(t). The NMR signal S(t) accumulates spurious phase shifts that show up in the raw k-space data and cause ghosting or blurring of artifacts in reconstructed images. Phase shifts $\Delta\phi$ accumulate as the integral of $B_0(t)$, or $\Delta\phi = \gamma \int \Delta B_0(t)dt$. These phase shifts accumulate continuously during the performance of a gradient recalled echo imaging pulse sequence, starting with the application of the RF excitation pulse and extending to data acquisition. Gradient echo scans are thus very sensitive to moving metal, particularly at long echo times TE.

Figure 4:
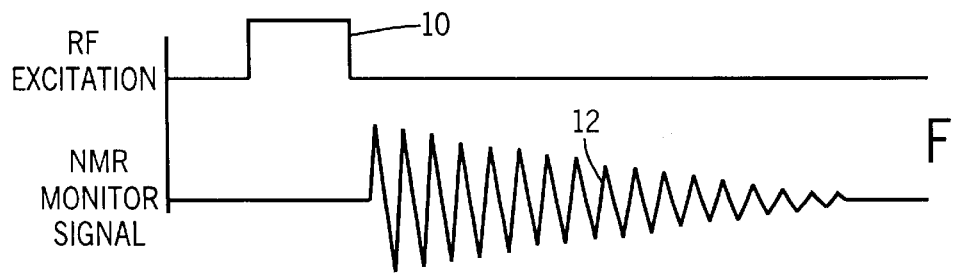
FIG. 4 is a graphic representation of a preferred embodiment of a monitor signal pulse sequence that may be employed in the MRI system of FIG. 1.

The apparatus and method of the present invention can be employed to compensate for moving metal variations in the polarizing field $B_0$ by measuring the frequency of a monitor NMR signal periodically during the scan, and then using that information to compensate the NMR data being acquired during the scan as a subsequent calibration step. In a preferred embodiment, these monitor NMR signals are produced by a separate monitor pulse sequence, as illustrated in FIG. 4, in which monitor signals are acquired from the monitor coil assembly 400 illustrated in FIG. 7. This monitor pulse sequence is interleaved with the imaging pulse sequences such that an NMR monitor signal is acquired every 50 to 100 msec during the scan. As will be described below, the acquired NMR monitor signals are processed and used to adjust the reference frequency employed in the transceiver module 150. The monitor coil assembly 400 is preferably disposed in the x-y plane and it is separately shimmed, as will be elaborated upon below. As such, the present invention provides for separate shimming requirements whereby the imaging region is shimmed in a conventional manner and the auxiliary shimmed region is shimmed in a subsequent calibration step.

More specifically, the present invention compensates for magnetic non-uniformities for both an imaging region and a small sampling region. In conventional "static" shimming, the requirement of achieving good quality shim in both regions is extremely difficult, if not altogether impossible, to achieve. In the present invention, the shimming requirements are separated whereby the imaging region is shimmed in a conventional manner and an auxiliary shimmed region is established as a subsequent calibration step of the system. By this invention, an electrical magnetic shim system uses a pulsed shim to switch between imaging and acquiring monitoring signals. Hence, the quality of the shim in the image region is improved, as it is not affected by the auxiliary shim, which is turned off during imaging, as indicated in FIG. 3. Thus, the present invention provides a dedicated monitoring probe outside the shimmed volume of the MRI magnet while retaining an adequate magnetic field so as to enable acquisition of useable monitoring signals. These signals compensate for the magnetic field drift and magnetic field errors that are caused by the moving metal objects.

Referring particularly to FIG. 4, the monitor pulse sequence includes a non-selective RF excitation pulse 10 having a flip angle of 90° and a duration of 0.5 msec. The RF excitation pulse 10 has a frequency that is set to correspond to the frequency of the spins from which the monitor signal will be acquired. After the termination of the RF excitation pulse 10, the system switches as fast as possible (approximately 200 $\mu$secs) to the receive mode and an NMR monitor signal 12 is acquired. A total of 256 samples of the monitor signal 12 are acquired at a rate of one sample every 16 $\mu$secs. As explained above, the I and Q values of each sample can be stored in the memory module 160.

Figures 5, 6:
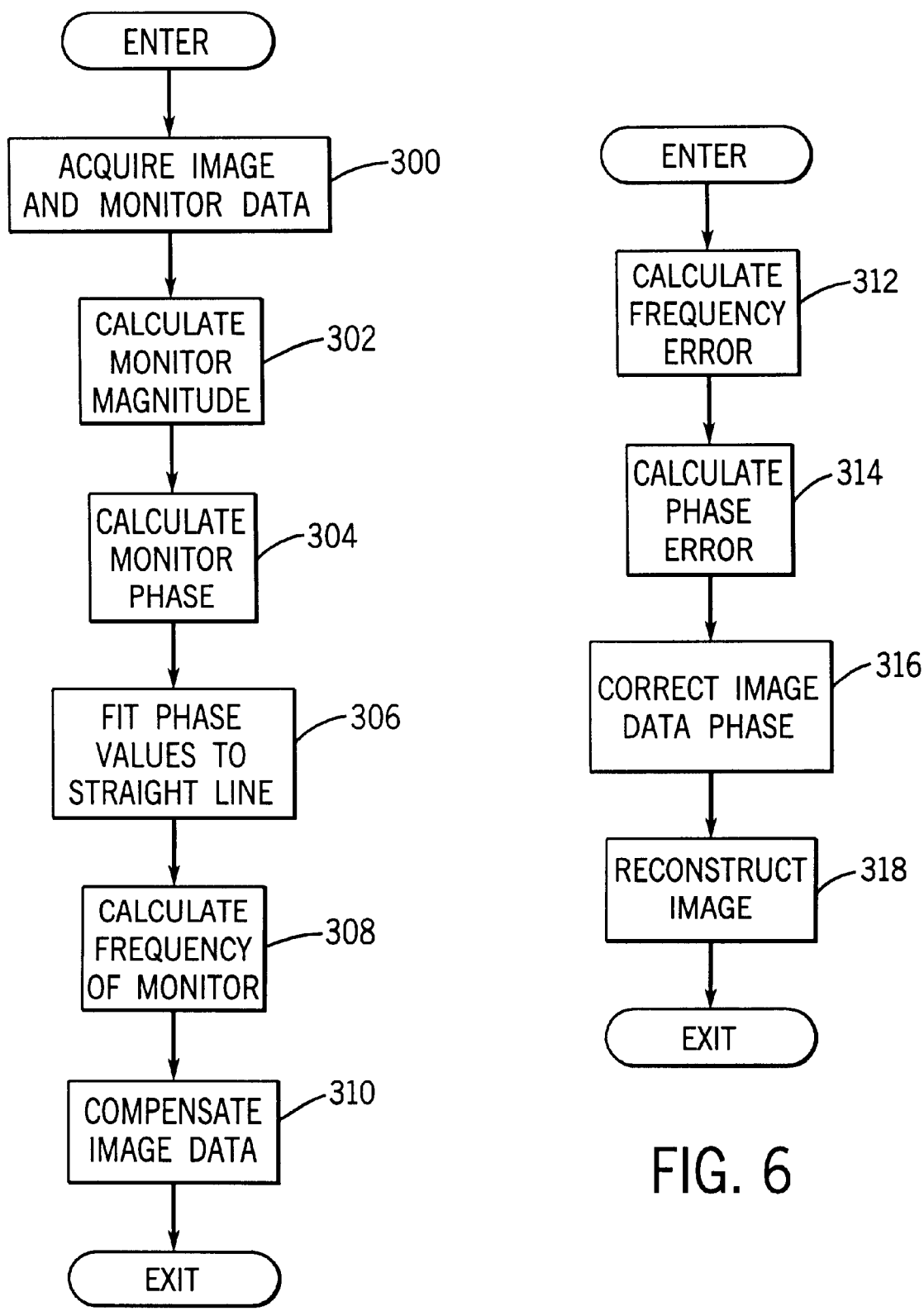
FIG. 5 is a flow chart of the steps used to practice a preferred embodiment of the invention.
FIG. 6 is a flow chart of additional steps used to practice another preferred embodiment of the invention.

Referring now to FIG. 5, the first step in practicing the method of the present invention is to acquire monitor signal data along with the image data that is to be compensated, as indicated at process block 300. The monitor data is promptly processed by first calculating the magnitude of each sample:

$$M = \sqrt{I^2 + Q^2}$$

as indicated at process block 302. The phase of each monitor signal sample is then calculated:

$$\phi = \tan^{-1}(I/Q)$$

as indicated at process block 304. In the preferred embodiment, the C code call to "atan2" is used for this calculation.

The calculated phase values φ for each of the 256 monitor signals samples are then fit to a straight line as indicated at process block 306. A weighted least squares fit subroutine is used to perform this step, where the magnitude values calculated in step 302 are used to weight the phase values. The frequency (f) of the monitor signal is then calculated, as indicated at process block 308, using the slope of the straight line fit to the measured phase values:

$$f = \Delta\phi/+t.$$

The frequency (f) is thus determined using a filtering function to determine the slope of the phase versus time values, using a so-called phase unwrapping method when the phase of the signal passes through the 2 π phase transition. The frequency (f) is the Larmor frequency of the excited spins at the polarizing field value $B_0$ at the moment the monitor signal was acquired. As indicated at process block 310, this frequency (f) is then used to compensate the acquired image data using one of the techniques now to be described.

In one preferred embodiment, the measured Larmor frequency (f) is used during the acquisition of subsequent image data. Referring to FIG. 2, the frequency (f) is output as a command to the frequency synthesizer 200 in the transceiver module 150 to control the frequency of the RF carrier signal on line 201. This carrier signal determines the center frequency of the RF excitation pulses that are produced by subsequent imaging pulse sequences, and it determines the demodulation frequency used to acquire subsequent NMR signals. This real-time compensation technique corrects for variations in the polarizing field $B_0$ before the NMR signals are acquired. It is preferred that when the separate monitor pulse sequence in FIG. 4 is employed, the corrected carrier frequency (f) is used for a 50 to 100 msec period during the scan until the next monitor signal is acquired and processed. The variations in the polarizing field function $B_0(t)$ are thus measured during the scan, and the carrier frequency (f) is changed in such a manner that the acquired NMR image data is unaffected. The higher the rate at which the polarizing field $B_0(t)$ is measured, the greater the accuracy of compensation.

If monitor signals are. acquired at a high rate in order to increase compensation accuracy, it may not be reasonably possible to change the transceiver carrier frequency fast enough to implement the prospective compensation technique. In such applications, the preferred compensation technique is to "retrospectively" correct the acquired k-space image data after it has been acquired.

Referring particularly to FIG. 6, the retrospective compensation technique changes the phase of the acquired k-space image data after it is has been acquired and stored. The first step, indicated by process block 312, is to calculate the frequency error due to changes in the polarizing field $B_0$. This is performed by subtracting from the Larmor frequency (f) measured with the contemporaneously acquired NMR monitor signal, a reference Larmor frequency ($f_0$) produced when the polarizing field $B_0$ is at an unperturbed reference value. The reference value is an average value over time, or it can be pre-selected. The phase error produced by this frequency error Δf is then calculated as indicated at process block 314. A phase correction −Δφ is made to each complex (I, Q) sample of the NMR image signal as indicated at process block 316. Similar corrections are made to each acquired NMR image signal in the k-space image data set using the frequency information derived from their associated NMR monitor signals. An image is then reconstructed as indicated at process block 318 using the compensated k-space data.

Referring now to the monitor coil assembly 400 in FIG. 7, it comprises an NMR sample 402, a monitor coil 404 disposed about the NMR sample 402, a set of shim coils 406 disposed adjacent to the monitor coil 404, and a set of shim amplifiers 136 (see FIG. 1) that are operable by the MRI system during acquisition of monitor data to produce electrical currents in the coils 406 that shim the polarizing field $B_0$ in the immediate vicinity proximal to the monitor coil 404.

More specifically, and as indicated in FIG. 1, the monitor coil assembly 404 is preferably cylindrical in shape and the shim coils 406 surround the NMR sample 402 on the top and bottom thereof. The set of shim coils 406 are disposed adjacent the monitor coil 404 such that the NMR sample 402 and monitor coil 404 are sandwiched between the shim coils 406. The plurality of shim coils 406 comprise a respective top and bottom layer 408, 410, each having a topmost coil for shimming in the x-direction, a second layer for shimming in the y-direction, a third layer for shimming in the z-direction, the second layer being intermediate the first and third layers. In addition, a higher order shim coil may also be provided for shimming in the so called $Z^2$ direction and the NMR sample 402 is preferably filled with a $CuSO_4$ solution having a concentration that provides $T_1$ and $T_2$ relaxation times of about 20 msec.

Figure 8:
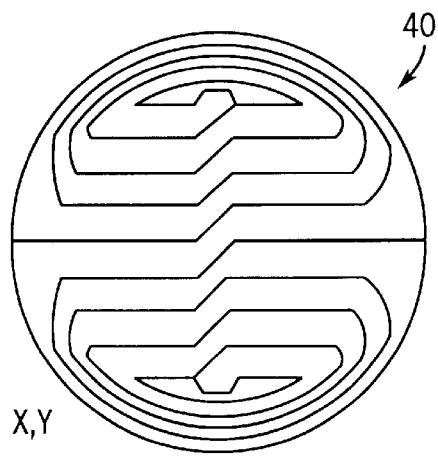
FIG. 8 is a linear shim coil winding pattern for use in the monitor coil assembly of FIG. 7.
Figure 9:
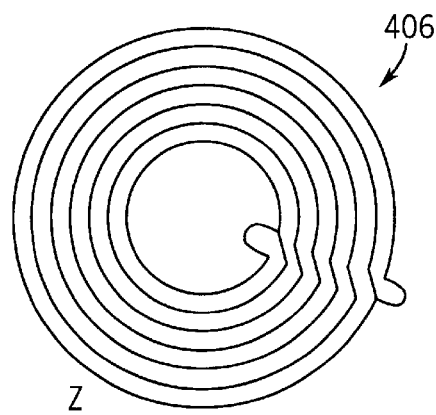
FIG. 9 is a Z linear shim coil winding pattern for use in the monitor coil assembly of FIG. 7.
Figure 10:
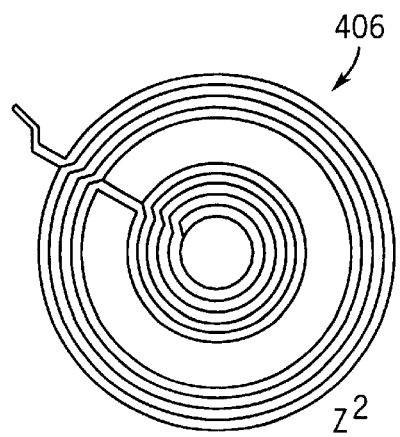
FIG. 10 is a $Z^2$ shim coil winding pattern for use in the monitor coil assembly of FIG. 7.

The set of shim coils 406 can be constructed using well-known techniques on a coil former. For example, the coil former may be constructed of a non-conductive plastic material or composite material having spaces machined therein to accept coil windings. In the preferred embodiment however, the shim coils 406 consist of patterns on printed circuit boards, as depicted in FIGS. 8–10.

Accordingly, the monitor coil assembly 400 of this invention is used to tune the shim coils 406 for the polarizing field $B_0$. As explained previously in reference to FIGS. 3–4, the monitor coil assembly 400 is switched on while acquiring monitor signals and off while acquiring imaging signals. The timing of this switch operation is controlled by control signals generated by the pulse generator module 121, which also controls the acquisition of the monitoring and imaging signals.

In the preferred embodiment, the shim coils 406 provides linear gradient fields in three axes in order to compensate for the afore-mentioned linear magnetic field non-uniformities. Alternative embodiments presenting higher order shims coils, such as the commonly called $Z^2$, $Z^3$, and $Z^4$ coils, may also be incorporated herein.

The top layer 408 in FIG. 7 comprises x, y, and z shim coils that correspond to the respective $G_x$, $G_y$, and $G_z$ gradient fields. Similarly, the bottom layer 410 also comprises x, y, and z shim coils that correspond to the respective $G_x$, $G_y$, and $G_z$ gradient fields. These shim coils 406 are driven by the shim amplifiers 136 shown in FIG. 1. Within this shim coil 406, the winding patterns of these shim coils 406 are shown in FIGS. 8–10, as will be elaborated upon presently.

FIG. 8 depicts a transverse linear shim coil winding pattern. It is used to generate the $G_x$ and $G_y$ gradient fields. The indicated coil winding pattern is the same for the top and bottom layers 408,410, but the $G_x$ and $G_y$ coils are rotated 90° apart with respect to one another. The electrical current flows in the same direction on the top and bottom layers 408, 410.

FIG. 9 depicts the Z-linear shim coil winding pattern. It is used to generate the $G_z$ gradient field. In this shim coil 406, the electrical current flows in opposite directions on the top and bottom layers 408, 410.

FIG. 10 depicts a higher order shim coil 406, namely a $Z^2$ coil winding pattern. The indicated coil winding pattern is the same for the top and bottom layers 408,410, and the electrical current flows in the same direction on the top and bottom layers 408,410 thereon.

Referring again to FIG. 1, it is desirable to place the monitor coil assembly 400 in a region that is homogeneous yet that does not interfere with the patient's positioning or scanning. In a preferred embodiment, this assembly is thus located below the patient and within the plane of the RF coil, e.g. disposed in the x-y plane.

We claim:

1. A monitor coil assembly for monitoring a polarizing magnetic field in an MRI system, the system including a shimmed MRI volume, the assembly disposed outside the shimmed MRI volume and comprising:

an NMR calibration sample for producing a monitor signal indicative of a strength of the polarizing magnetic field, the NMR monitor signal being monitored by the MRI system to compensate for changes in the polarized magnetic field during acquisition of image data;

a radio frequency monitor coil disposed around the NMR calibration sample;

a set of shim coils disposed adjacent the radio frequency monitor coil and outside the shimmed MRI volume; and a set of shim coil amplifiers operable by the MRI system to produce electrical currents in the set of shim coils to compensate the polarizing field in a vicinity proximal to the radio frequency monitor coil during acquisition of magnetic field monitor data and to stop the flow of electrical currents in the set of shim coils during acquisition of image data.

2. The monitor coil assembly as recited in claim 1 wherein the radio frequency monitor coil is disposed in the x-y plane.

3. The monitor coil assembly as recited in claim 1 wherein the NMR calibration sample comprises a CuSO4 solution.

4. The monitor coil assembly as recited in claim 1 wherein the NMR calibration sample is housed in a non-conductive material.

5. The monitor coil assembly as recited in claim 1 wherein the shim coils comprise a pattern on a printed circuit board.

6. The monitor coil assembly as recited in claim 5 wherein the pattern on the printed circuit board comprises a linear shim coil winding pattern.

7. The monitor coil assembly as recited in claim 5 wherein the pattern on the printed circuit board comprises a Z linear shim coil winding pattern.

8. The monitor coil assembly as recited in claim 5 wherein the pattern on the printed circuit board comprises a $Z^2$ shim coil winding pattern.

9. The monitor coil assembly as recited in claim 5 wherein the pattern on the printed circuit board comprises a $Z^3$ shim coil winding pattern.

10. A method for providing real time compensation for changes in a polarizing magnetic field while acquiring an image from a subject with an MRI system comprising:

performing an imaging pulse sequence with the MRI system a plurality of times to acquire image data of a subject in the polarizing magnetic field, the system including a shimmed MRI volume;

interleaving a monitoring pulse sequence performed with the MRI system between successive imaging pulse sequences in order to acquire data from an RF monitoring coil disposed around an NMR calibration sample located near the subject and disposed outside the shimmed MRI volume, the NMR calibration sample providing a calibration signal indicative of changes in the polarizing field;

shimming the polarizing field in the immediate vicinity of the RF monitoring coil by activating a shim coil disposed outside the shimmed MRI volume during the monitoring pulse sequence and deactivating the shim coil during the image pulse sequence; and compensating for changes in the polarizing field during acquisition of image data based on changes in the calibration signal.

11. The method as recited in claim 1 wherein the NMR sample is housed in non-conductive material.

12. The method as recited in claim 1 wherein the NMR sample comprises a $CuSO_4$ solution.

13. The monitor coil assembly as recited in claim 1 wherein the shim coils comprise a pattern on a printed circuit board.

14. The monitor coil assembly as recited in claim 13 wherein the pattern on the printed circuit board comprises a linear shim coil winding pattern.

15. The monitor coil assembly as recited in claim 13 wherein the pattern on the printed circuit board comprises a Z linear shim coil winding pattern.

16. The monitor coil assembly as recited in claim 13 wherein the pattern on the printed circuit board comprises a $Z^2$ linear shim coil winding pattern.

17. The method as recited in claim 10 wherein a set of shim coil amplifiers, operable by the MRI system during acquisition of monitor data, produce the current in the shim coil.

18. The method as recited in claim 10 wherein the shim coil is disposed adjacent the monitor coil.

* * * * *